(12) United States Patent
Minamio et al.

(10) Patent No.: US 7,970,033 B2
(45) Date of Patent: Jun. 28, 2011

(54) SEMICONDUCTOR DEVICE AND ELECTRONIC EQUIPMENT USING SAME

(75) Inventors: Masanori Minamio, Osaka (JP);
Noriyuki Yoshikawa, Osaka (JP);
Shinichi Ijima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/510,785

(22) Filed: Jul. 28, 2009

(65) Prior Publication Data
US 2010/0046564 A1 Feb. 25, 2010

(30) Foreign Application Priority Data

Aug. 20, 2008 (JP) ................................ 2008-211917
Jun. 5, 2009 (JP) ................................ 2009-135780

(51) Int. Cl.
*H01S 3/04* (2006.01)
(52) U.S. Cl. ..................................... 372/43.01; 372/109
(58) Field of Classification Search ............... 372/43.01, 372/109
See application file for complete search history.

(56) References Cited

U.S. PATENT DOCUMENTS

| 5,302,850 | A | * | 4/1994 | Hara .............................. 257/667 |
| 6,181,720 | B1 | | 1/2001 | Kanemoto et al. |
| 7,068,694 | B2 | | 6/2006 | Yamamoto |
| 7,075,178 | B2 | | 7/2006 | Yamamoto |
| 7,428,255 | B2 | | 9/2008 | Yamamoto |
| 2003/0168749 | A1 | * | 9/2003 | Koike ........................... 257/791 |
| 2004/0240502 | A1 | | 12/2004 | Yamamoto |
| 2005/0072985 | A1 | | 4/2005 | Yamamoto |
| 2005/0074043 | A1 | * | 4/2005 | Yamamoto ....................... 372/43 |

FOREIGN PATENT DOCUMENTS

| JP | 06-045703 | 2/1994 |
| JP | 2007-012979 | 1/2007 |

* cited by examiner

*Primary Examiner* — Kinam Park
(74) *Attorney, Agent, or Firm* — McDermott Will & Emery LLP

(57) ABSTRACT

A semiconductor device includes: a first lead having an element mounting portion; a second lead located in a same plane as the first lead, with a predetermined space left between the first lead and the second lead; a molding encapsulant made of a resin for fixing the leads; and a semiconductor element affixed to a top surface of the element mounting portion of the first lead. The molding encapsulant covers at least part of each of upper and lower surfaces of the leads. A resin injection hole mark, which is a mark of a hole through which the encapsulant has been injected, is left on the encapsulant, and part of the resin injection hole mark is located above the first lead or the second lead, and the remaining part of the resin injection hole mark is located above a space between the first lead and the second lead.

11 Claims, 2 Drawing Sheets

SEMICONDUCTOR DEVICE AND ELECTRONIC EQUIPMENT USING SAME

CROSS-REFERENCE TO RELATED APPLICATIONS

This application claims priority from Japanese Patent Application No. 2008-211917 filed on Aug. 20, 2008, and Japanese Patent Application No. 2009-135780 filed on Jun. 5, 2009, which is hereby incorporated by reference in its entirety for all purposes.

BACKGROUND

The present invention relates to a semiconductor device used, for example, in a light source, and electronic equipment using the semiconductor device.

A semiconductor device used in a conventional laser light source is hereinafter described.

A semiconductor device used in a conventional laser light includes at least a first lead having an element mounting portion and a second lead located in substantially the same plane as the first lead, with a predetermined space left between the first lead and the second lead.

The first lead and the second lead are fixed by an encapsulant made of a transfer-molding resin (hereinafter referred to as a molding encapsulant) which fixes at least part of each of upper and lower surfaces of the first and second leads. A laser diode is affixed to the top surface of the element mounting portion of the first lead. A semiconductor device having a structure similar to this structure is disclosed, for example, in Japanese Laid-Open Patent Application Publication No. 6-45703.

According to a conventional semiconductor device, at least part of each of the upper and lower surfaces of the first and second leads needs to be covered with the molding encapsulant in the transfer molding process for fixing the first and second leads. Thus, a resin injection hole of the mold is located so as to face the first or second lead, and in this state the resin is injected into the mold.

Specifically, the resin is injected so as to hit an upper surface of the first or second lead, and after this hit, the flow of the resin is changed to a direction parallel to the upper surface of the lead. The resin then moves to a lower surface of the lead.

A resin injection hole mark (a mark of the hole formed in the mold through which the resin has been injected) is therefore left in the upper area of one of the first and second leads after the transfer molding process.

SUMMARY

As a result of miniaturization of electronic equipment, a reduction in size of semiconductor devices mounted in the electronic equipment is demanded. For example, a reduction in thickness of the molding encapsulant is demanded.

A problem is, however, that the structure of the conventional semiconductor device cannot have sufficient strength. In other words, to downsize the semiconductor device by reducing the thickness of the molding encapsulant, the resin injection hole of the mold needs to be located close to the upper surface of the first or second lead facing the resin injection hole.

However, the flow of the resin cannot be sufficiently ensured if the resin injection hole of the mold is located close to the upper surface of the lead. As a result, the molding encapsulant covering part of each of upper and lower surfaces of the first and second leads may be broken, or air may be included in the molding encapsulant and voids are generated. Thus, sufficient strength as a semiconductor device cannot be ensured.

The present invention may be advantageous in solving the above problem and improving the strength of a semiconductor device in which a plurality of leads are fixed by an encapsulant made of a molding resin.

To achieve the above, a semiconductor device of the present invention has the structure in which part of a resin injection hole of a mold is located so as to face any one of a plurality of leads and in which the remaining part of the resin injection hole is located so as to face a space between the plurality of leads.

Specifically, a semiconductor device according to the present invention includes: a first lead having an element mounting portion; a second lead located in a same plane as the first lead, with a predetermined space left between the first lead and the second lead; an encapsulant made of a transfer-molding resin for fixing the first lead and the second lead; and a semiconductor element affixed to a top surface of the element mounting portion of the first lead, wherein the encapsulant covers at least part of upper and lower surfaces of the first lead and at least part of upper and lower surfaces of the second lead, and a resin injection hole mark, which is a mark of a hole through which the encapsulant is injected, is left on the encapsulant, and part of the resin injection hole mark is located above the first lead or the second lead, and the remaining part of the resin injection hole mark is located above a space between the first lead and the second lead.

According to a semiconductor device of the present invention, part of a resin is injected so as to hit the upper surface of one of the first and second leads, and after this hit, the flow of the resin is changed to a direction parallel to the upper surface of the lead, and therefore, the resin smoothly moves over the upper surface of the lead. In addition, the rest of the resin smoothly moves to the lower surface, too, through a space between the first and second leads. This eliminates the possibilities that the encapsulant covering at least part of each of the upper and lower surfaces of the first and second leads may be broken or that air may be included in the encapsulant. As a result, sufficient strength as a semiconductor device can be ensured.

In a semiconductor device of the present invention, it is preferable that an area of the first lead or the second lead that faces the resin injection hole mark is a thin area at which a thickness of the first lead or the second lead is smaller than the other area of the first lead or the second lead that does not face the resin injection hole mark.

In the above case, it is preferable that the area of the first lead or the second lead that faces the resin injection hole mark is formed by being punched out downward from the resin injection hole mark side.

In the semiconductor device of the present invention, it is preferable that the semiconductor element is a laser diode.

Electronic equipment according to the present invention includes the semiconductor device of the present invention as a light source.

As described in the above, a semiconductor device and electronic equipment according to the present invention can increase the strength of a semiconductor device in which a plurality of leads are fixed by a molding resin.

BRIEF DESCRIPTION OF THE DRAWINGS

FIG. 1A is a plan view; FIG. 1B is a bottom view; and FIG. 1C is a side view.

DETAILED DESCRIPTION

Example Embodiment

An example embodiment is described, with reference made to the drawings.

Figure 1A:
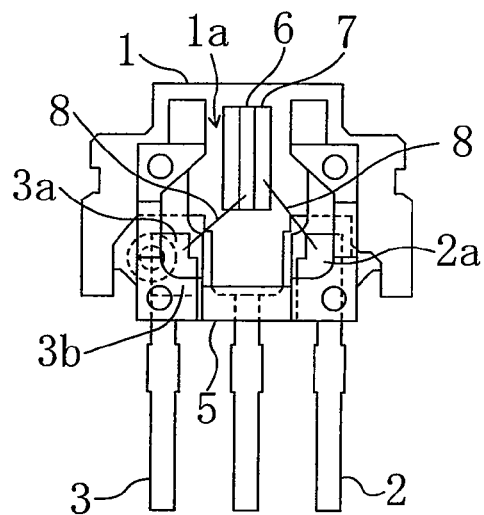
FIG. 1A to FIG. 1C show a semiconductor device according to an example embodiment.
Figure 1B:
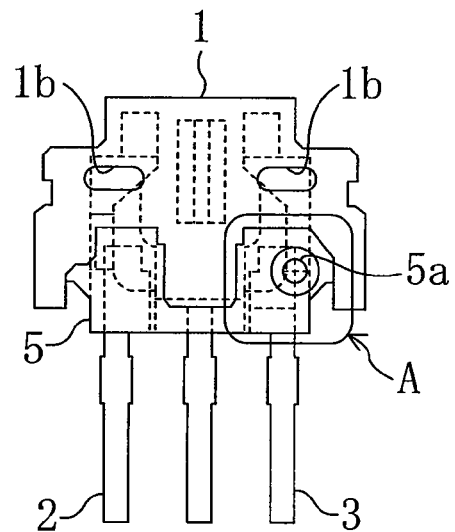
Figure 1C:
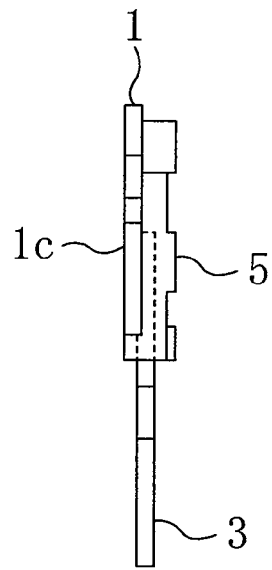

FIG. 1A to FIG. 1C show a semiconductor device according to an example embodiment. FIG. 1A shows a structure in plan view; FIG. 1B is a structure viewed from below; and FIG. 1C is a structure viewed from side.

As shown in FIG. 1A to FIG. 1C, a semiconductor device according to the present embodiment includes: a first lead 1 having an element mounting portion 1a; a second lead 2 and a third lead 3 each being located in substantially the same plane as the first lead, with a predetermined space left from the first lead 1; a molding encapsulant 5 made of a transfer-molding resin for fixing the first lead 1, the second lead 2 and the third lead 3 by covering at least part of each of upper and lower surfaces of the first lead 1, the second lead 2 and the third lead 3; and a semiconductor element, such as a laser diode 6, which is affixed to the top surface of the element mounting portion 1a of the first lead 1, with a submount 7 interposed between the element mounting portion 1a and the semiconductor element.

As shown in FIG. 1A, the laser diode 6 held on the submount 7 is connected to a connecting terminal 3a, which is provided on the third lead 3 and exposed at the surface of the molding encapsulant 5, by a fine metal wire 8. The submount 7 is connected to a connecting terminal 2a, which is provided on the second lead 2 and exposed at the surface of the molding encapsulant 5, by a fine metal wire 8.

The semiconductor device shown in FIG. 1A to FIG. 1C is mainly used for pickup such as optical disks. The first lead 1 has a width of approximately 3 mm to 6 mm, and a thickness including a thickness of the molding encapsulant 5 is approximately 1.0 mm to 2.0 mm. The dimensions of the laser diode 6 are a width of approximately 0.2 mm to 0.4 mm and a length of approximately 0.5 mm to 3 mm.

As shown in FIG. 1A to FIG. 1C, the molding encapsulant 5 covers upper and lower surfaces of the leads 1 to 3. The molding encapsulant 5 has a squared "U" shape in plan view and lies so as to surround three sides of the laser diode 6 on the upper surface shown in FIG. 1A, and a squared "U" shape on the lower surface, too, as shown in FIG. 1B. Here, the mounting holes 1b provided at lateral sides of the element mounting portion 1a of the first lead 1 are filled with the molding encapsulant 5 on the upper surface.

As shown in FIG. 1B, the resin injection hole mark 5a (a mark of the resin injection hole through which the resin has been injected) is left on the lower surface of the molding encapsulant 5.

A method for fabricating a semiconductor device that is configured as in the above, in particular, a method for forming the molding encapsulant 5, is hereinafter described with reference made to the drawings.

Figure 2:
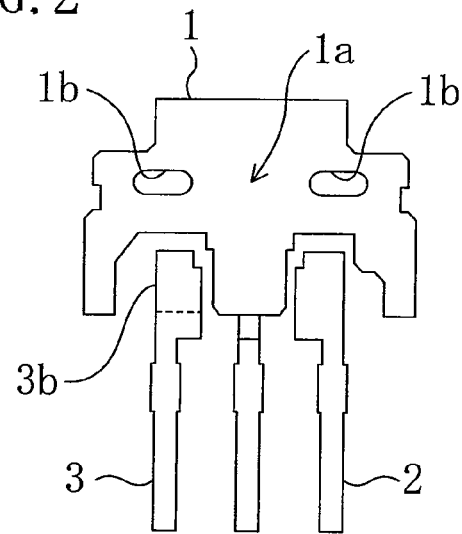
FIG. 2 shows a plan view of leads which constitute a semiconductor device according to an example embodiment.

First, the first lead 1, the second lead 2 and the third lead 3 illustrated in FIG. 2 are prepared. The third lead 3 has a thin area 3b, where the thickness of the third lead 3 is reduced at the lower surface of an end of the third lead 3 which points the first lead 1, as shown in FIG. 2.

Figure 3:
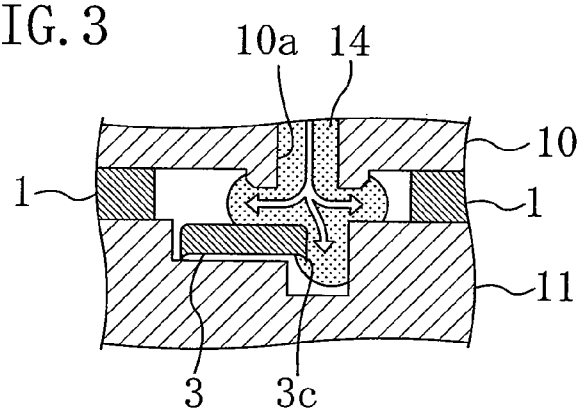
FIG. 3 illustrates a transfer molding process in a method of fabricating a semiconductor device according to an example embodiment, and is a cross-sectional view taken along the line III-III of FIG. 4.

Then, as shown in FIG. 3, the upper and lower surfaces of the leads 1 to 3 are sandwiched between an upper mold 10 and a lower mold 11, and in this state, a transfer-molding resin 14 (hereinafter simply referred to as a resin) is injected through the resin injection hole 10a formed in the upper mold 10. Here, FIG. 4 shows an enlarged area A of FIG. 1B.

Figure 4:
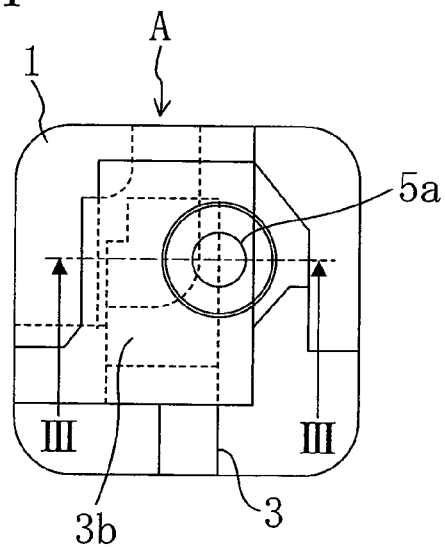
FIG. 4 is an enlarged bottom view of the area A of FIG. 1B.

At this time, part (in this case, approximately half) of the resin injection hole 10a of the upper mold 10 is located above the third lead 3, and the remaining part of the resin injection hole 10a is located above a space between the first lead 1 and the third lead 3 as shown in FIG. 3 and FIG. 4. Due to this structure, part (approximately half) of the resin 14 injected through the resin injection hole 10a hits the upper surface of the third lead 3, and the flow of the resin 14 is changed to a direction parallel to the upper surface of the third lead 3. Thus, the resin 14 moves smoothly over the upper surfaces of the leads 1 to 3. The rest of the resin 14 moves to the lower surfaces of the leads 1 to 3 through the space between the first lead 1 and the third lead 3. The resin 14 moves smoothly over the lower surfaces as well. As a result, sufficient strength as a semiconductor device can be ensured without causing breakage of the molding encapslant 5 covering part of each of the upper and lower surfaces of the leads 1 to 3, or including air in the molding encapslant 5.

The resin injection hole 10a is located at the base of the squared "U" shaped resin 14 (molding encapsulant 5) in plan view, within an area from which the distances to the both right and left ends of the squared "U" shaped molding encapsulant 5 do not differ much. Due to this structure, the resin 14 can surely reach to each end of the molding encapslant 5. Further, the surface of the third lead 3 that is opposite to the surface to which the resin injection hole 10a faces is exposed at the surface of the molding encapsulant 5 and used as the second connecting terminal 3a to which the fine metal wire 8 is connected. It is thus necessary to prevent the resin 14 from spreading into the exposed surface. According to the present embodiment, part (approximately half) of the resin 14 injected through the resin injection hole 10a hits the third lead 3, and therefore, the third lead 3 is pressed against the lower mold 11 as shown in FIG. 3. Thus, no space is created between the third lead 3 and the lower mold 11, and this can prevent the resin 14 from spreading in. As a result, a space for the second connecting terminal 3a to which the fine metal wire 8 is connected can be kept on the third lead 3.

According to the present embodiment, as shown in FIG. 4, the resin injection hole mark 5a is left at a place on the molding encapsulant 5 that corresponds to the resin injection hole 10a in the upper mold 10 after the transfer molding process. In other words, part of the resin injection hole mark 5a is located above the third lead 3, and the remaining part of the resin injection hole mark 5a is located above the space between the first lead 1 and the third lead 3.

Further, as mentioned earlier, part of the third lead 3 that faces part of the resin injection hole mark 5a has a thin area 3b, where the thickness of the third lead 3 is reduced to be thinner than the thickness of the other part of the third lead 3 and thickness of the first lead 1 and the second lead 2, according to the present embodiment. The thin area 3b formed at part of the third lead 3 that faces part of the resin injection hole mark 5a helps the resin 14 injected through the resin injection hole 10a of the upper mold 10 to flow in easily.

The thin area 3b is formed by applying a predetermined load for reducing the thickness before the leads 1 to 3 are separated. The leads 1 to 3 are cut out by applying pressure from the lower surface to the upper surface, and therefore, as shown in the cross-sectional view of FIG. 3, burrs 3c are left at the thin area 3b. Due to these burrs 3c, the resin 14 can be easily flow in.

A semiconductor device according to the present embodiment is mounted on a mounting substrate included in electronic equipment such that its attachment reference surface 1c (bottom face of the first lead 1, shown in FIG. 1C) is mounted on the mounting substrate, and used as a desired light source. A reduction in size of the electronic equipment is thus possible by using the semiconductor device according to the present embodiment. In addition, since the semiconductor device itself has great strength, it can greatly contribute to downsizing of the electronic equipment.

In the case where a semiconductor device according to the present embodiment is a semiconductor laser device, the thickness and size of an optical pickup in which the semiconductor laser device is used can be reduced. Thus, the semiconductor laser device according to the present embodiment can contribute to a reduction in size and thickness of an optical disk drive which includes the optical pickup using the semiconductor laser device according to the present embodiment.

In the present embodiment a laser diode is used as a semiconductor element mounted on the semiconductor device. However, the semiconductor element is not limited to a laser diode, and a light emitting diode (LED) can be used.

As described in the above, a semiconductor device according to the present embodiment can improve the strength of a semiconductor device in which a plurality of leads are fixed by an encapsulant made of a molding resin, and is useful for a semiconductor device used, for example, in a light source, and for electronic equipment etc. using the semiconductor device.

What is claimed is:

1. A semiconductor device comprising:
   a first lead having an element mounting portion;
   a second lead disposed with a predetermined space left between the first lead and the second lead;
   an encapsulant made of a transfer-molding resin for fixing the first lead and the second lead; and
   a semiconductor element disposed on a top surface of the element mounting portion of the first lead, wherein:
   the encapsulant covers at least part of upper and lower surfaces of the first lead and at least part of upper and lower surfaces of the second lead, and
   a resin injection hole mark, which is a mark of a hole through which the encapsulant is injected, is left on the encapsulant, and part of the resin injection hole mark is located above the first lead or the second lead, and the remaining part of the resin injection hole mark is located above a space between the first lead and the second lead.

2. A semiconductor device comprising:
   a first lead having an element mounting portion;
   a second lead disposed with a predetermined space left between the first lead and the second lead;
   an encapsulant made of a transfer-molding resin for fixing the first lead and the second lead; and
   a semiconductor element disposed on a top surface of the element mounting portion of the first lead, wherein:
   the encapsulant covers at least part of upper and lower surfaces of the first lead and at least part of upper and lower surfaces of the second lead,
   a resin injection hole mark, which is a mark of a hole through which the encapsulant is injected, is left on the encapsulant, and part of the resin injection hole mark is located above the first lead or the second lead, and the remaining part of the resin injection hole mark is located above a space between the first lead and the second lead, and
   an area of the first lead or the second lead that faces the resin injection hole mark is a thin area at which a thickness of the first lead or the second lead is smaller than the other area of the first lead or the second lead that does not face the resin injection hole mark.

3. The semiconductor device of claim 2, wherein the area of the first lead or the second lead that faces the resin injection hole mark is formed by being punched out downward from the resin injection hole mark side.

4. The semiconductor device of claim 1, wherein the semiconductor element is a laser diode.

5. Electronic equipment comprising the semiconductor device of claim 1 as a light source.

6. The semiconductor device of claim 2, wherein the semiconductor element is a laser diode.

7. Electronic equipment comprising the semiconductor device of claim 2 as a light source.

8. Electronic equipment comprising the semiconductor device of claim 4 as a light source.

9. Electronic equipment comprising the semiconductor device of claim 6 as a light source.

10. The semiconductor device of claim 1, wherein the second lead is disposed in a same plane as the first lead.

11. The semiconductor device of claim 2, wherein the second lead is disposed in a same plane as the first lead.

* * * * *